United States Patent
Chang et al.

(10) Patent No.: US 11,211,333 B2
(45) Date of Patent: Dec. 28, 2021

(54) THROUGH SILICON VIA OPTIMIZATION FOR THREE-DIMENSIONAL INTEGRATED CIRCUITS

(71) Applicant: Taiwan Semiconductor Manufacturing Co., Ltd., Hsinchu (TW)

(72) Inventors: Fong-Yuan Chang, Hsinchu (TW); Chin-Chou Liu, Jhubei (TW); Chin-Her Chien, Chung-Li (TW); Po-Hsiang Huang, Tainan (TW); Noor Mohamed Ettuveettil, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/507,629

(22) Filed: Jul. 10, 2019

(65) Prior Publication Data
US 2020/0020635 A1 Jan. 16, 2020

Related U.S. Application Data

(60) Provisional application No. 62/698,763, filed on Jul. 16, 2018.

(51) Int. Cl.
*H01L 23/538* (2006.01)
*H01L 25/065* (2006.01)
*H01L 23/532* (2006.01)

(52) U.S. Cl.
CPC .... *H01L 23/5384* (2013.01); *H01L 23/53214* (2013.01); *H01L 23/53228* (2013.01); *H01L 23/53257* (2013.01); *H01L 25/0657* (2013.01)

(58) Field of Classification Search
CPC ............. H01L 23/5384; H01L 25/0657; H01L 23/53257; H01L 23/53228; H01L 23/53214; H01L 24/80; H01L 2924/16195; H01L 2224/04105; H01L 2224/06181; H01L 2224/08145; H01L 2224/80895; H01L 2224/80896; H01L 2924/15311; H01L 23/5286; H01L 23/5226;
(Continued)

(56) References Cited

U.S. PATENT DOCUMENTS 6,291,272 B1 * 9/2001 Giri ...................... H01L 21/4857
438/108
6,380,087 B1 * 4/2002 Gupta ...................... H01L 24/02
438/692
(Continued)

*Primary Examiner* — Marcos D. Pizarro
*Assistant Examiner* — Sue Tang
(74) *Attorney, Agent, or Firm* — Sterne, Kessler, Goldstein & Fox P.L.L.C.

(57) ABSTRACT

The present disclosure describes a semiconductor structure includes a first chip with a first conductive line and a first conductive island formed on the first conductive line. The first chip also includes a first plurality of vias formed in the first conductive island and electrically coupled to the first conductive line. The semiconductor structure further includes a second chip bonded to the first chip, where the second chip includes a second conductive line and a second conductive island formed on the second conductive line. The second chip also includes a second plurality of vias formed in the second conductive island and electrically coupled to the second conductive line.

18 Claims, 10 Drawing Sheets

(58) Field of Classification Search
CPC .............. H01L 25/50; H01L 25/18; H01L 2225/06513; H01L 2225/06517; H01L 2225/06555; H01L 2225/06541; H01L 2224/16145; H01L 23/538

See application file for complete search history.

(56) References Cited

U.S. PATENT DOCUMENTS

| | | | |
|---|---|---|---|
| 6,831,371 B1* | 12/2004 | Huemoeller | H01L 23/49827 174/260 |
| 10,123,419 B2* | 11/2018 | Pihlman | H01L 23/49833 |
| 2002/0106886 A1* | 8/2002 | Sethuraman | H01L 21/3212 438/618 |
| 2017/0062366 A1* | 3/2017 | Enquist | H01L 24/05 |

* cited by examiner

THROUGH SILICON VIA OPTIMIZATION FOR THREE-DIMENSIONAL INTEGRATED CIRCUITS

CROSS-REFERENCE TO RELATED APPLICATION

This application claims the benefit of U.S. Provisional Patent Application No. 62/698,763, titled "Though Silicon Via Optimization for Three-dimensional Integrated Circuit," which was filed on Jul. 16, 2018 and is incorporated herein by reference in its entirety.

BACKGROUND

A 3D integrated circuit (3D IC) includes a semiconductor device with two or more layers of active electronic components integrated (e.g., vertically stacked and connected) to form an integrated circuit. Various forms of 3D IC technology are currently being developed including die-on-die stacking, die-on-wafer stacking, and wafer-on-wafer stacking. 3D IC systems with increased chip density can exhibit high IR drop (e.g., voltage drop) compared to their two-dimensional counterparts. Increased power consumption in three-dimensional system on integrated chip structures can lead to high power consumption and poor device performance.

BRIEF DESCRIPTION OF THE DRAWINGS

Aspects of the present disclosure are best understood from the following detailed description when read with the accompanying figures. It is noted that, in accordance with common practice in the industry, various features are not drawn to scale. In fact, the dimensions of the various features may be arbitrarily increased or reduced for clarity of discussion.

DETAILED DESCRIPTION

Figure 1:
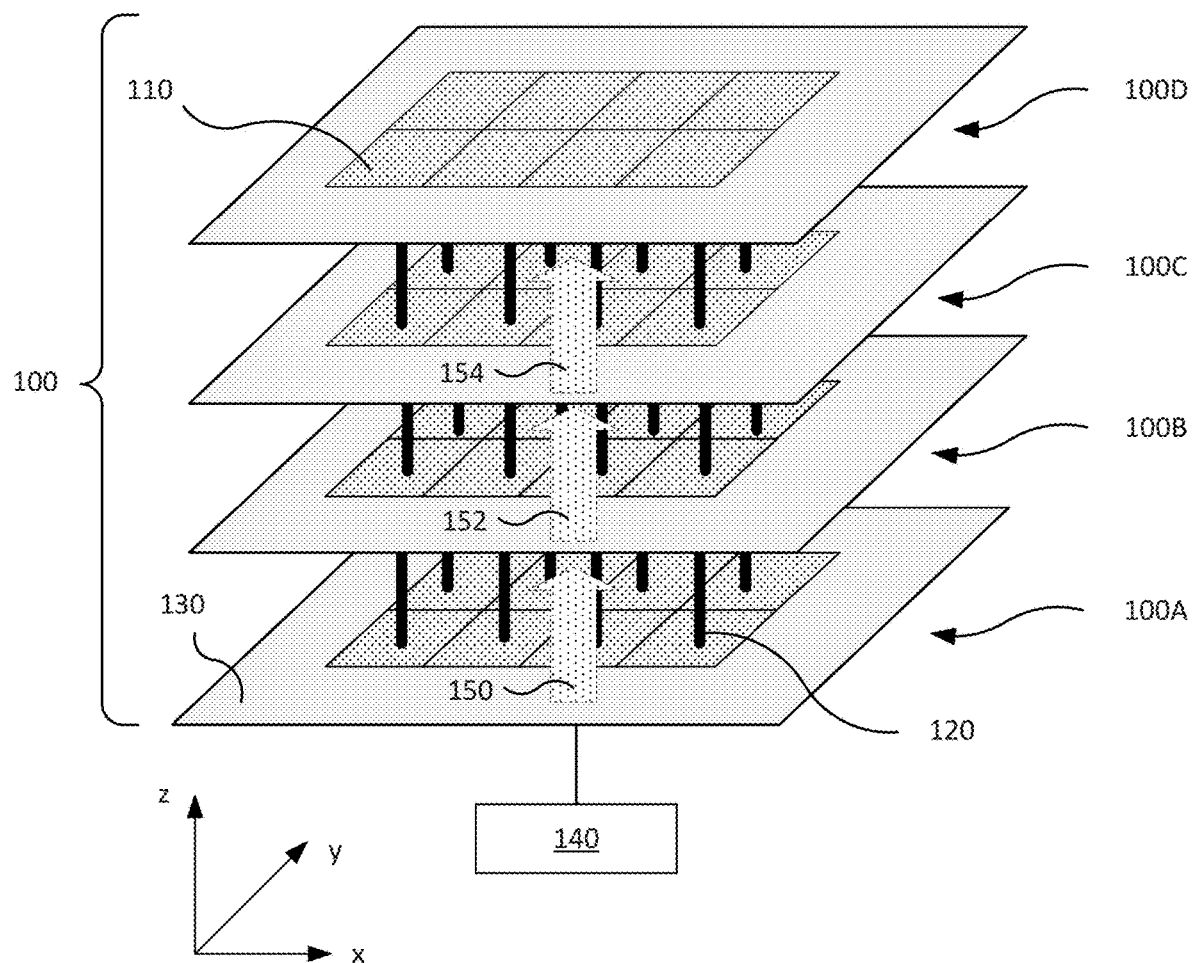
FIG. 1 is a partial isometric view of a three-dimensional system on integrated chip structure, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

The term "vertical," as used herein, means nominally perpendicular to the surface of a substrate.

The terms "substantially" and "about" as used herein indicates the value of a given quantity that can indicate a value of a given quantity that varies within, for example, +5% of a target (or intended) value (e.g., ±1%, ±2%, ±3%, ±4%, or ±5% of the value).

A three-dimensional (3D) integrated circuit ("3D IC") structure is a non-monolithic vertical structure that includes, for example, two to eight two-dimensional (2D) flip chips stacked on top of each other through various bonding techniques, such as hybrid bonding. The 2D flip chips can be a compilation of chips with different functionality, such as logic chips, memory chips, radio frequency (RF) chips, and the like. By way of example and not limitation, the logic chips can include central process units (CPUs) and the memory chips can include static access memory (SRAM) arrays, dynamic random access memory (DRAM) arrays, magnetic random access memory (MRAM) arrays, or other types of memory arrays. In the 3D IC structure, each of the 2D chips can be interconnected via micro-bumps, by through silicon vias (TSV), hybrid bonding, or by other types of interconnect structures, which can be shorter than interconnects used in a 2D IC structure. Thus, 3D IC structures can be faster, denser, and have additional functionality than their 2D counterparts. Further, the 3D IC structures can have a smaller footprint compared to 2D IC, structures.

3D IC is powered by power wire grids including power lines and ground lines. Since 3D IC structures have increased chip density and a reduced footprint, they have higher power density per unit area and can be more susceptible to power consumption issues compared to 2D IC structures. Power wire grids are usually electrically connected to one end of the 3D IC package and supply power to each flip chip through conductive structures, such as power grid pillars formed by TSVs. However, as more chips are stacked on top of each other, increased depths of TSVs in 3D IC structures can lead to increased resistances and large IR drops (e.g., greater than 5% voltage drop). For example, deep TSVs can increase the resistance of interconnects and TSVs, deteriorate the performance of the chips, and reduce the lifetime of the 3D IC structures.

To address the above shortcomings, embodiments described herein are directed to reducing IR drop in 3D IC structures. For example, exemplary embodiments at least include (i) power grid (PG) via arrays including TSVs that reduce PG electrical resistance; (ii) a grid wall including vias can be formed along a perimeter of the chip and surrounding the active devices; (iii) via islands formed between PG wires of adjacent metal layers or chips; and (iv) conductive bonding pads providing additional contact area between PG wires if the PG wires are not aligned (e.g., not directly above one another with a horizontal offset), it should be noted that the structures and methods described in the present application can also be applied to other conductive structures, such as signal carrying wires, ground wires, and any other suitable conductive structures.

According to some embodiments, FIG. 1 is an isometric illustration of a 3D IC structure 100, 3D IC structure 100 includes four chip layers (e.g., 100A, 100B, 100C, and 100D); however, the number of chip layers is not limiting and fewer or additional chip layers are possible (e.g., 2, 6, or 8). For illustration purposes, FIG. 1 includes select portions of a 3D IC structure and other portions (not shown) may be included. For example, micro-bumps, molding regions, dummy regions, adhesion layers, a heat sink, interconnects, ball grid array (BGA) connectors, silicon interposers, and other components or structural elements may be included. In some embodiments, peripheral structures 130 can provide mechanical support and/or provide thermal conduction for heat dissipation. Each chip layer can include one or more chips 110, which are electrically connected to chips in adjacent chip layers through vertical electrical conductive structures 120. In some embodiments, vertical electrical conductive structures 120 can include TSVs, through dielectric vias (TDVs) or other types of vertical interconnect structures. By way of example and not limitation, bottom chip layer 100A can include one or more microprocessors or CPUs, while chip layers 100E through 100D can include one or more memory chips (e.g., SRAM chips, DRAM chips, MRAM chips, other types of memory chips, or combinations thereof). Prior to stacking, a contact surface of each chip is planarized and chips are bonded at these contact surfaces using suitable bonding technologies, such as hybrid bonding, fusion bonding, anodic bonding, direct bonding, room temperature bonding, pressure bonding, and/or combinations thereof.

In some embodiments, power supply 140 is electrically connected to bottom chip layer 100A through interconnects, such as BGA connectors. The power is supplied to all chip layers 100A to 100D through vertical electrical conductive structures 120. As power is provided in series through chip layers 100A through 100D, electrical resistance of each chip layer will introduce an IR drop in the voltage supply for the subsequently bonded chip layer which in turn leads to undesirable increased power consumption. For example, due to electrical resistances caused by power grid structures and hybrid bonded surfaces, IR drops 150, 152, or 154 can occur between chip layers 100A through 100D, and chip layer 100D would receive a voltage supply much lower than power supply 140 that is supplied to chip layer 100A. As an increased number of chips are stacked in 3D IC structures, chip layers further away from the power supply (e.g., chip layer 100D) can experience undesirable large IR drops (e.g., greater than 5% of the voltage supply).

Figure 2:
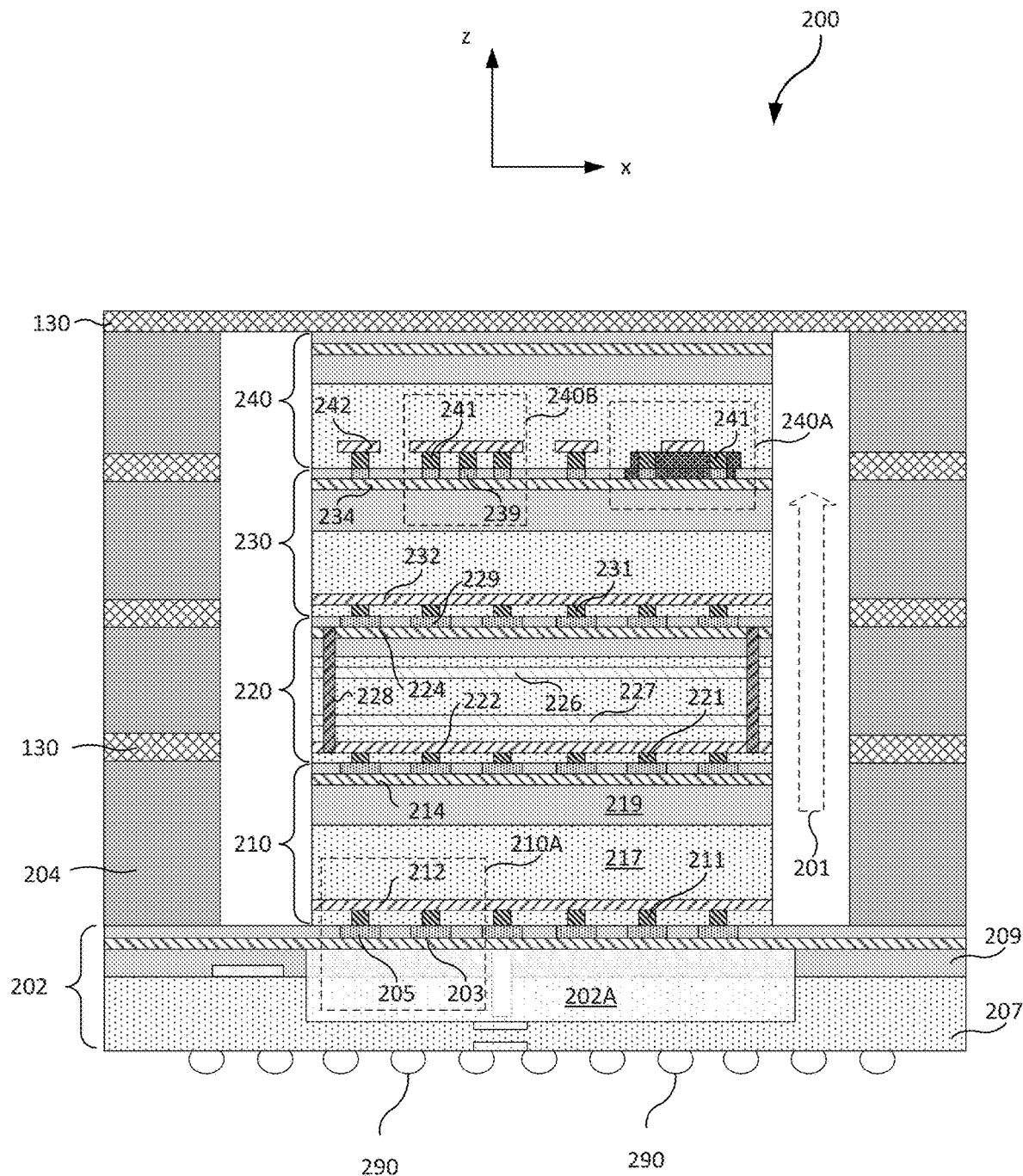
FIG. 2 is a cross-sectional view of a three-dimensional system on integrated chip structure having reduced IR drop, according to some embodiments.

FIG. 2 is a cross-sectional view of 3D IC structure incorporating various embodiments of PG via arrays, grid wall, and via islands, in accordance to some embodiments of the present disclosure. 3D IC structure 200 is similar to 3D IC structure 100, but includes additional electrical components or structural elements. For example, 3D IC structure 200 includes a stack of chips 210, 220, 230, and 240, dummy regions 204 that surround the stack of chips 210-240, vertical conductive structures within each chip and/or between chips, a bottom layer 202 with a logic chip 202A below the stack of chips 210-240. Package bumps 290 are electrically coupled to logic chip 202A. Exemplary 3D IC structure 200 can further include other suitable structures and are not illustrated in FIG. 2 for simplicity. Components in exemplary 3D IC structure 200 are for illustration purposes and are not drawn to scale.

Dummy regions 204 can be electrically non-functional structures that provide structural support and/or thermal conduction to the bonded devices. By way of example and not limitation, dummy regions 204 can provide structural support to 3D IC structure 200 and include a combination of dielectric materials with metal or metallic layers. The chips in 3D IC structure 200 can be electrically coupled to neighboring top and bottom chips through vertical conductive structures and pads. Package bumps 290 are conductive structures, such as solder balls, that can be electrically connected to power supplies or other packages to form package on package (PoP) structures. In some embodiments, there can be under bump metallization (UBM) structures formed underneath their respective package bumps 290. In some embodiments, peripheral structures 130 can provide mechanical support and/or provide thermal conduction for heat dissipation.

Chips 210-240 and logic chip 202A can be stacked and bonded to form PoP structures. As an electrical connection is formed between stacked chips through conductive structures embedded in their respective top dielectric layers, hybrid bonding (e.g., metal-to-metal and nonmetal-to-nonmetal bonding processes) can be used to bond these chips together. As electrical power and/or signal is transmitted from the bottom-most chip to the top-most chip, for example, in a direction illustrated as direction 201, the power supply to each subsequent chip decreases due to electrical resistances. The electrical resistances can arise, for example, due to internal structures within each chip or through interconnect structures between each bonded chip. In some embodiments, each chip can include PG wires and TSVs for distributing and supplying power to devices within the chip. For example, chip 220 includes internal PG wires 226 and 227. In some embodiments, each chip can also include TSVs and bonding pads at the bonding interface between bonded chips to be connected to top and bottom PG wires.

3D IC structure 200 in FIG. 2 incorporates various structures to reduce IR drop to reduce power consumption which are further described in FIGS. 3A-8. For example, 3D IC structure 200 includes PG via arrays having TSVs formed between parallel PG wires of different metal layers or chips, as illustrated in block 210A. 3D IC structure 200 also includes chip 220 with grid walls formed along a perimeter of chip 220 and surrounding its active devices. 3D IC structure 200 further includes chips 230 and 240 having via islands formed between PG wires of adjacent metal layers or chips, as well as conductive bonding pads that provide additional contact area between PG wires, as illustrated in blocks 240A and 240B, respectively.

Figure 3A:
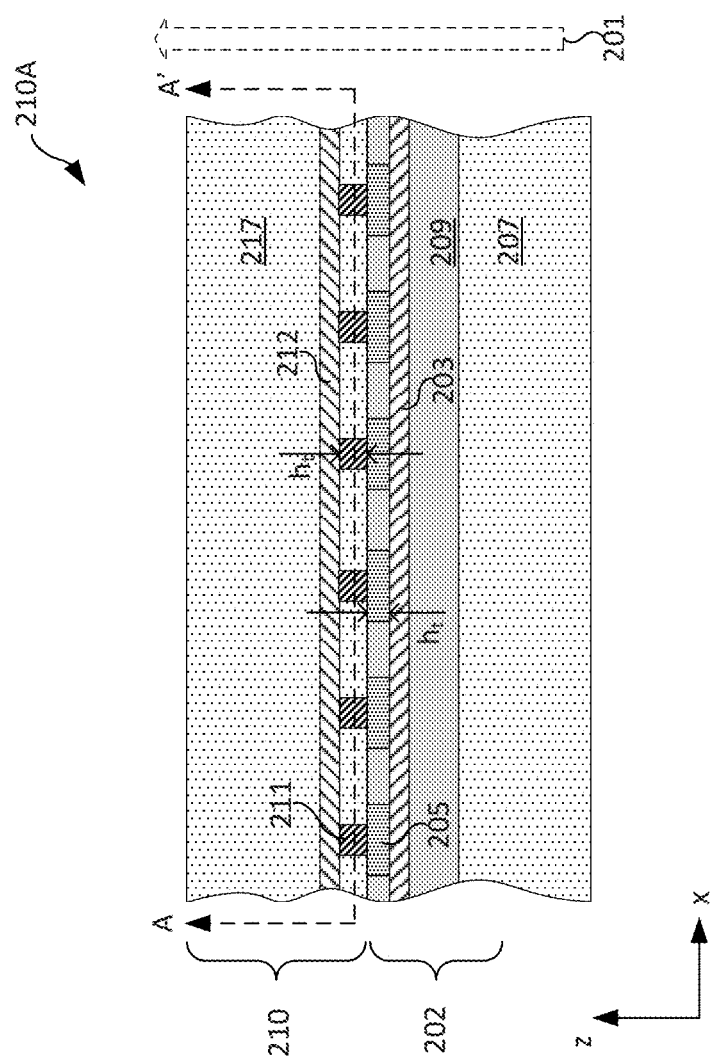
FIG. 3A-7B are various views of three-dimensional system on integrated chip structures with various configurations of IR drop reducing structures, according to some embodiments.
Figure 3B:
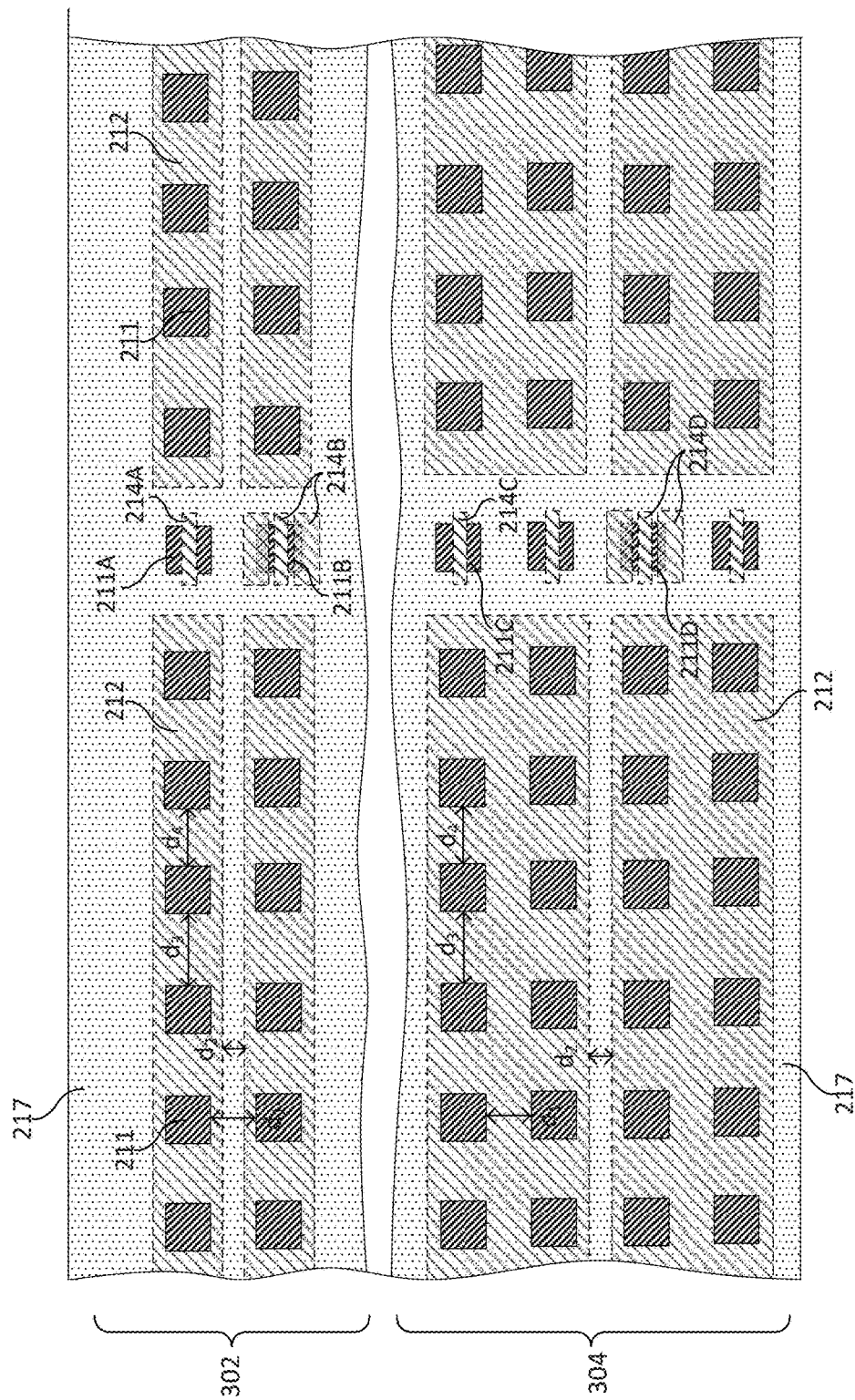

FIGS. 3A-3B illustrate PG via arrays that includes TSVs/TDVs formed between PG wires of different metal layers or chips, in accordance with some embodiments of the present disclosure. FIGS. 3A-3B can be enlarged views of block 210A of FIG. 2 and adjacent structures. Exemplary portions of the 3D IC structure in FIGS. 3A-3B can further include other suitable structures and are not illustrated for simplicity.

Components in the portions of the 3D IC structure are for illustration purposes and are not drawn to scale.

FIG. 3A is a cross-sectional view of an exemplary 3D IC structure including TSVs formed between PG wires of different metal layers of chips. FIG. 3B is a view of block 210A as viewed from plane A-A'. Bottom layer 202 includes a first dielectric layer 207 and a second dielectric layer 209. Conductive structures, such as PG wire 203 and TSVs 205, are embedded in second dielectric layer 209 for power and/or signal distribution. Similarly, first chip 210 includes a first dielectric layer 217 and conductive structures, such as PG wire 212 and TSVs 211, embedded in first dielectric layer 217 for power and/or signal distribution. The PG wires and TSVs above are provided as examples; other conductive structures can be included, in which the positioning and configuration structure can vary depending on design needs. PG wires 203, 212 and TSVs 205, 211 can be formed of conductive materials, such as copper, cobalt, aluminum, tungsten, doped polysilicon, other suitable conductive material, and/or combinations thereof. FIG. 3B illustrates uniform grid via arrays 302 and non-uniform grid via array 304. As shown in uniform grid via array 302, each PG wire 212 can include a single row of vias 211. Non-uniform grid via array 304 can be formed in a region where each PG wire 212 includes two or more rows of vias 211. In some embodiments, the 3D IC structure can include a combination of uniform and non-uniform grid via arrays 302 and 304, depending on device need. In some embodiments, separation $d_1$ between adjacent vias 211 of different PG wires can be in a range between about 0.4 µm and about 0.8 µm, this range will dependent of process technology node used in the design and its value will be different for different process technology node. In some embodiments, separation $d_2$ between adjacent PG wires can be in a range between about 0.45 µm and 1.35 µm, this range will dependent of process technology node used in the design and its value will be different for different process technology node. In some embodiments, via pitch can be different or the same within a PG wire. For example, separations $d_3$ and $d_4$ between adjacent vias can be the same or different. In some embodiments, separations $d_3$ and/or $d_4$ can be in a range between about 0.4 µm and about 0.8 µm; this range will dependent of process technology node used in the design and its value will be different for different process technology node. As an example, in uniform grid via array 302, separations $d_1$ and $d_2$ can be substantially equal to each other while separations $d_3$ and $d_4$ can be substantially equal to each other. In some embodiments, in non-uniform grid via array 304, separations $d_1$ and $d_2$ can be substantially equal to each other while separations $d_3$ and $d_4$ can be substantially equal to each other or different.

In some embodiments, signal networks can be formed between PG wires for transmitting electric signals. For example, signal networks can be used to transmit signals for operating digital circuits, analog circuits, mixed-signal circuits, static random access memory (SRAM) circuits, embedded SRAM circuits, dynamic random access memory (DRAM) circuits, embedded DRAM circuits, non-volatile memory circuits, and the like. Signal networks can include conductive lines to transmit signals within one interconnect layer or conductive lines and TSVs to transmit signals between different interconnect layers. As shown in FIG. 3B, signal network can include TSVs 211A-211D and conductive lines 214A-214D that are connected to other suitable interconnect structures (not shown in FIG. 3B for simplicity). In some embodiments, TSVs of the signal networks can be electrically connected one or more conductive lines. For example, TSV 211A in uniform grid array 302 can be connected to a single conductive line 214A. As another example, TSV 211B can be connected to more than one conductive lines 214B and formed in uniform grid array 302. In some embodiments, TSVs and conductive lines for signal networks can be formed in non-uniform grid arrays 304. For example, TSVs 211C and conductive lines 214C can be formed in non-uniform grid array 304. Similarly, TSVs 211D and conductive lines 214D can also be formed in non-uniform grid array 304.

Bottom layer 202 and first chip 210 are hybrid bonded at the interface between the two chips, and TSVs 205 and 211 are bonded through metal-to-metal bonding while second dielectric layer 209 and first dielectric layer 217 are bonded through nonmetal-to-nonmetal bonding, according to some embodiments. In some embodiments, thickness of PG wires 203 and 212 can be determined by various factors, such as device needs and technology nodes. In some embodiments, thicknesses of PG wires 203 and 212 can be between a range of about 0.8 µm and about 1.25 µm. In some embodiments, PG wires 212 and 203 can be electrically connected to the same voltage level, such as $V_{SS}$ (e.g., ground voltage reference) or $V_{DD}$ (e.g., power supply voltage reference) of integrated circuit power supply lines. In some embodiments, PG wires 203 and 212 can be electrically connected to different voltage sources.

Aligning PG wires from adjacent metal layers such that the PG wires extend in the same direction allows more TSVs to be formed between the PG wires and reduces electrical resistance between the PG wires. In some embodiments, aligning PG wires from adjacent metal layers can be performed by rotating one of the chips by 90° such that the wires are parallel or extend in substantially the same direction. As shown in FIG. 3A, PG wires 203 and 212 both extend in the same horizontal x-direction. Because electrical resistance is inversely proportional to the effective total cross-sectional area of the conductive structures, electrical resistance can be reduced along the direction 201 illustrated in FIG. 3A. Electrical resistance is proportional to the length of the conductor; therefore, keeping other variables constant, a conductor with greater length along the direction of the current will exhibit greater resistance. Therefore, the total resistances of the TSVs along the direction of the current (e.g., direction 201) can be determined by a height of TSVs (i.e., illustrated as $h_t$ along the z-direction). In some embodiments, the height $h_t$ can be in a range of about 1 µm to about 3 µm. For example, TSV 205 and 211 can have a thickness of about 2.8 µm; this value differs for different process technology node.

Figure 4A:
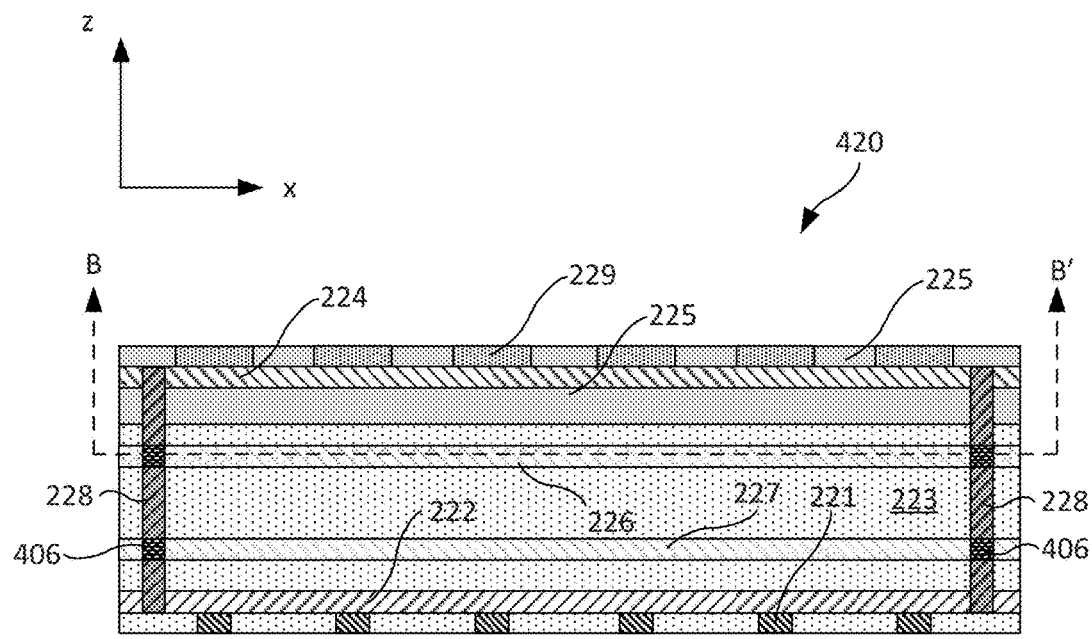
Figure 4B:
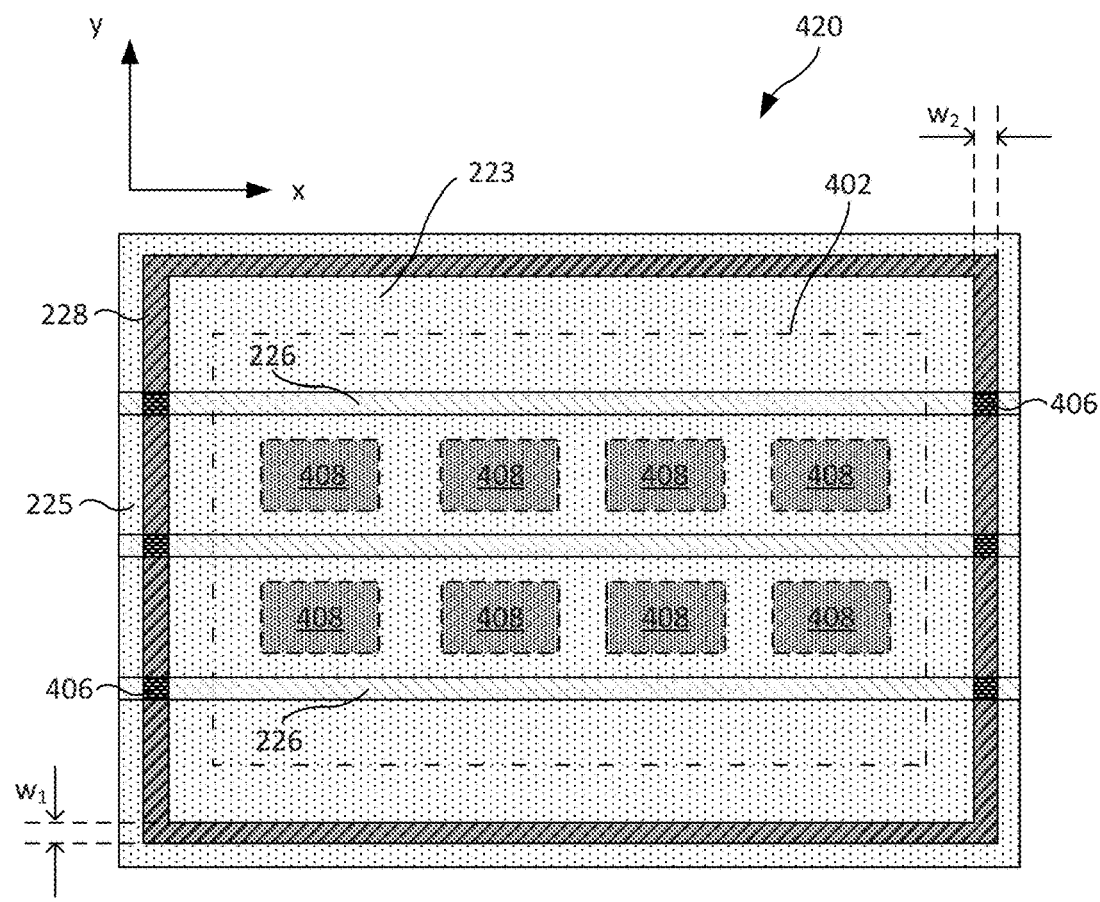

FIGS. 4A-4B illustrate various views of portions of a 3D IC structure incorporating grid walls, in accordance with some embodiments. In some embodiments, the portions of 3D IC structures shown in FIGS. 4A-4B can be similar to second chip 220 illustrated in FIG. 2, and similar elements are labelled with the same numerals for simplicity. However, this repetition does not in itself dictate a relationship between the various embodiments and/or configurations discussed. FIGS. 4A-4B illustrate chip 420 having a first dielectric layer 223, a second dielectric layer 225, PG wires 226 and 227, top/bottom PG wires 222 and 224, grid wall 228, and top/bottom vias 229 and 221. Exemplary portions of the 3D IC structure in FIGS. 4A-4B can further include other suitable structures and are not illustrated for simplicity. Components in portions of the 3D IC structure are for illustration purposes and are not drawn to scale.

FIG. 4A is a cross-sectional view of chip 420 that incorporates grid wall to increase effective cross-sectional area of vias and in turn reduces electrical resistance. As shown in FIG. 4A, a grid wall 228 including vias 406 can be formed along a perimeter of chip 420 and can extend through multiple layers of 3D IC 420. In some embodiments, grid wall 228 can extend through various dielectric layers and provide electrical connection to one or more metal layers. For example, grid wall 228 can be electrically connected to top/bottom PG wires 222 and 224 and PG wires 226 and 227. In some embodiments, grid wall 228 can also be connected to other conductive structures and are not shown in FIGS. 4A-4B for simplicity. In some embodiments, the PG wires can be formed in any suitable metal layer of the 3D IC structure. For example, the vias 406 can be formed in metal 0 layer (M0) of a back-end-of-line (BEOL) structure. M0 metal lines (e.g., a local interconnect that represents a first interconnect level and electrically connects to an underlying semiconductor device through a via). In some embodiments, PG wires can be formed in an M1 layer which can be local interconnects that represent a second interconnect level—above the first interconnect level—and electrically connects to one or more underlying M0 metal lines through one or more vias.

FIG. 4B is a plan view of chip 420 along plane B-B'. As shown in FIG. 4B, grid wall 228 is formed along a perimeter of chip 420 and surrounding a device region 402. Device region 402 can include passive/active devices 408. In some embodiments, passive/active devices 408 can include capacitors, inductors, and/or transistors arranged to be CMOS circuits, RE circuitry, and the like. In some embodiments, passive/active devices 408 can be formed in a dielectric layer below PG wires 226. Grid wall 228 can increase cross-sectional areas of the vias and in turn reduce electrical resistance. In some embodiments, a width of grid wall 228 along a first horizontal direction (e.g., x-direction) can be in a range between about 5 μm and about 10 μm. In some embodiments, a width of grid wall 228 along a second horizontal direction (e.g., y-direction) can be in a range between about 5 μm and about 10 μm. In some embodiments, the width range choice is flexible and can be other suitable values based on total design power requirement. For example, width of grid wall 228 can be greater than about 10 μm and less than about 20 μm. In some embodiments, grid wall 228 can be formed using conductive materials, such as copper, cobalt, aluminum, tungsten, doped polysilicon, other suitable conductive material, and/or combinations thereof. In some embodiments, grid wall 228 can be formed during the deposition of metal layers without adding any additional fabrication steps.

Figure 5A:
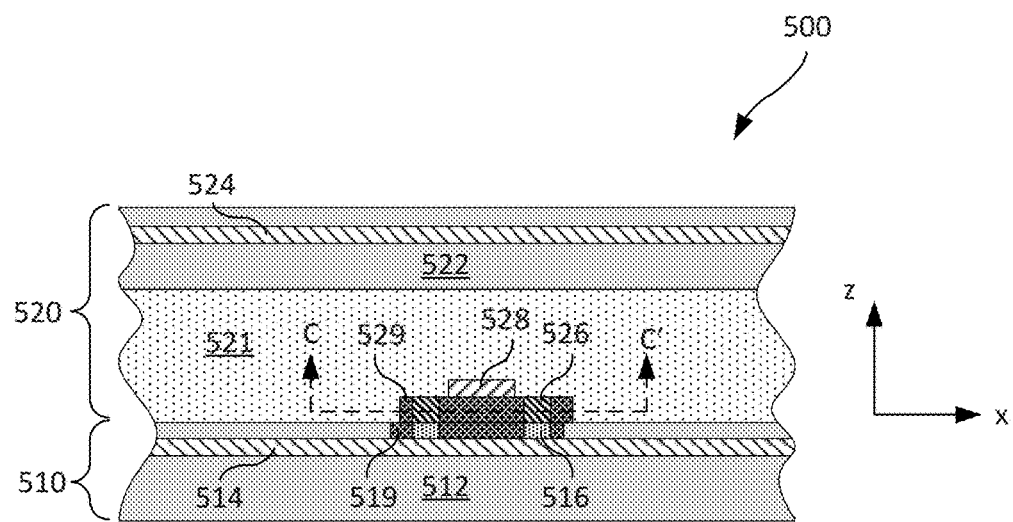
Figure 5B:
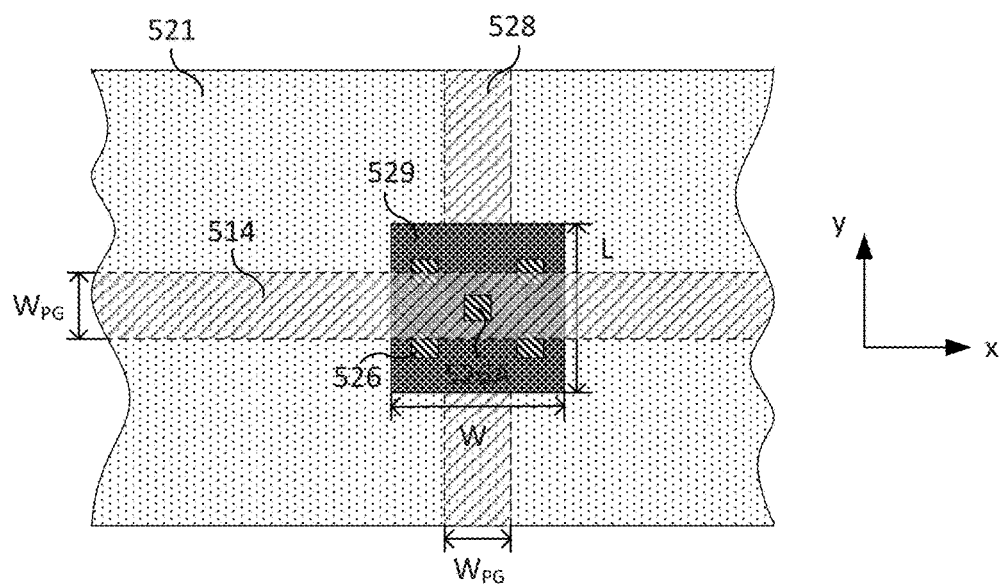
Figure 5C:
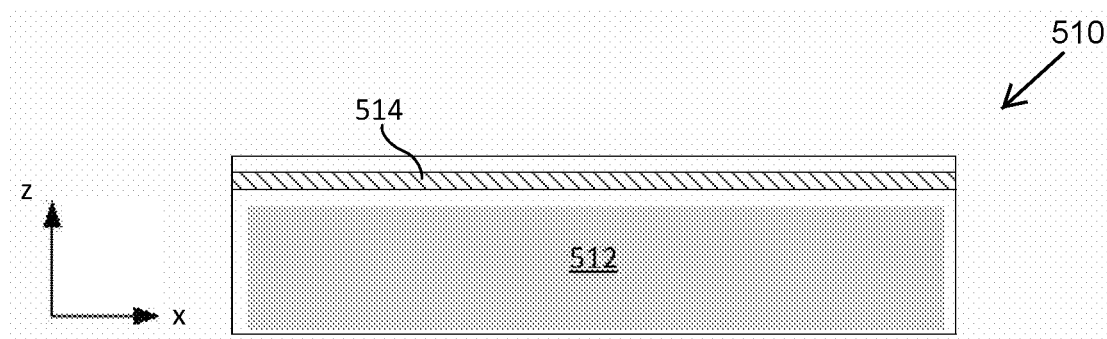
Figure 5D:
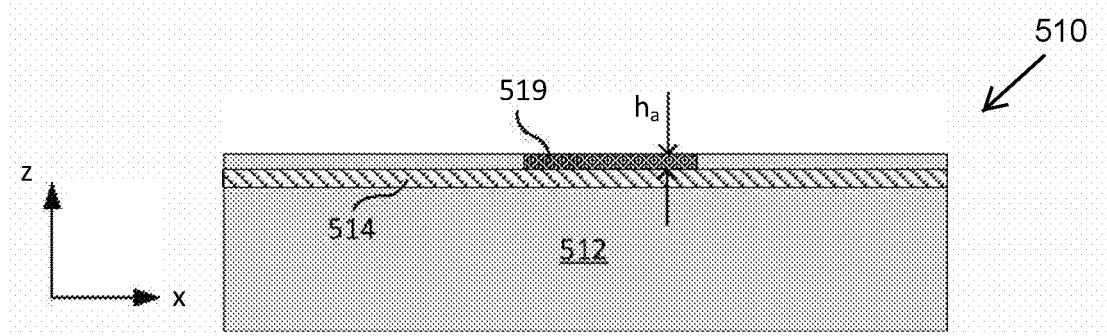
Figure 5E:
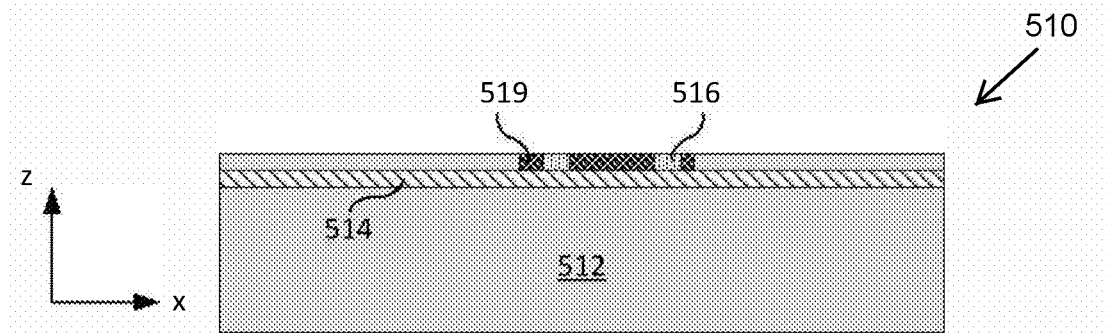

FIGS. 5A-5B illustrate various views of portions of a 3D IC structure incorporating via islands that can be formed between PG wires of adjacent metal layers or chips, in accordance to some embodiments of the present disclosure. FIGS. 5C-5E illustrate an exemplary fabrication process for forming via islands in 3D IC structures, in accordance to some embodiments of the present disclosure. The via islands can provide additional contact area between the PG wires and allow additional vias to be formed. The additional contact area and vias can reduce electrical resistance and in turn reduce IR drop across chips. Exemplary portions of the 3D IC structure in FIGS. 5A-5B can further include other suitable structures and are not illustrated for simplicity. Components in portions of the 3D IC structure are for illustration purposes and are not drawn to scale.

FIG. 5A is a cross-sectional view of portions of 3D IC structure 500 incorporating via islands 519 and 529 that can be formed between PG wires of hybrid-bonded chips 510 and 520. As shown in FIG. 5A, first chip 510 includes a substrate 512, a PG wire 514, and a via island 519 with vias 516 embedded therein. Similarly, second chip 520 includes dielectric layer 521, substrate 522, PG wire 524, via island 529 with vias 526 embedded therein. First and second chips 510 and 520 are bonded together using any suitable bonding technique, such as hybrid bonding techniques. For example, via islands 519 and 529 and vias 516 and 526 are respectively aligned to one another and bonded through a metal-metal bonding process, while substrate 512 and dielectric layer 521 are bonded through nonmetal-nonmetal bonding techniques. In some embodiments, PG wires 514 and 528 are substantially perpendicular to each other. For example, in FIG. 5A, PG wire 528 extends into the page (e.g., y direction, not shown in FIG. 5A but shown in FIG. 5B) and PG wire 514 extends along the x direction. In some embodiments, PG wires 514 and 528 traverse in different directions. In some embodiments, via islands 519 and 529 can be aligned without substantial offset.

FIG. 5B is a view of 3D IC structure 500 as viewed from plane C-C'. As described above, FIG. 5A shows that via island 529 is formed between PG wires 514 and 528. Although via island 529 and vias 526 are formed in different layers of 3D IC structure 500, FIG. 5B illustrates both PG wires 514 and 528 with reference to via island 529 for clarity. In some embodiments, PG wires 514 and 528 are electrically connected through via 526A, which is placed within the area where PG wires 514 and 528 overlap. However, to reduce electrical resistance between PG wires 514 and 528, via island provides additional metal-metal bonded areas in the hybrid bond between chips 510 and 520. Because electrical resistance is inversely proportional to the effective cross-section area of the conductor, a greater metal-metal bonded area can reduce the electrical resistance between PG wires 514 and 528. In some embodiments, vias 516 and 526 are optionally formed in via islands 519 and 529 respectively, and may further reduce contact resistance. For example, vias 516 and 526 can be formed using a conductive material that has lower resistivity than via islands 519 and 529. In some embodiments, via island 529 can have a width W that is in a range between about 2 μm and about 5 μm. In some embodiments, via island 529 can have a length L that is in a range between about 2 μm and about 5 μm, but varies with process technology node. In some embodiments, PG wires 514 and 528 can have a width $W_{PG}$ that is in a range between about 0.45 μm and about 11 μm. In some embodiments, the width W of via island 529 can be greater than the width $W_{PG}$ of PG wire 528. A greater surface area of via island 529 (e.g., length multiplied by width) can result in a lower electrical resistance and in turn reduce the IR drop between PG wires 514 and 528. In addition, the dimensions of via island 529 can depend on various factors, such as device crosstalk prevention, amount of device area available, and any other suitable factors.

FIGS. 5C-5E illustrate and exemplary fabrication process for forming via islands in 3D IC structures, in accordance to some embodiments of the present disclosure. Exemplary portions of the 3D IC structure in FIGS. 5C-5E can further include other suitable structures and are not illustrated for simplicity. Components in portions of the 3D IC structure are for illustration purposes and are not drawn to scale.

FIG. 5C illustrates chip 510 including substrate 512 and PG wire 514 formed in substrate 512. Chip 510 can include additional structures, such as other dielectric layers, conductive interconnect structures, and passive/active devices (not shown in FIG. 5C for clarity and simplicity).

Substrate 512 can include various suitable semiconductor structures and are collectively referred to as substrate 512 for simplicity. For example, substrate 512 can include various transistor devices such as fin field-effect transistors (finFETs), gate-all-around (GAA) devices, sensors, application-specific integrated circuit (ASIC), field programmable gate array (FPGA), memory devices, microelectromechanical system (MEMS), any suitable device, or any combination thereof. In some embodiments, substrate 512 can include interconnect structures such as interconnect structures of a back-end-of-line (BEOL) structure. PG wires described in the present disclosure can be formed at suitable metal layers of the BEOL structure, such a first metal layer (e.g., an M1 layer), a second metal layer (e.g., an M2 layer), and/or any suitable layers. Substrate 512 can also include suitable dielectric layers such as interlayer dielectric layers (ILDs), shallow trench isolation (STI), These structures can be formed within substrate 512 and are not illustrated for simplicity. In some embodiments, substrate 512 can be a p-type substrate, such as a silicon material doped with a p-type dopant (e.g., boron). In some embodiments, substrate 512 can be an n-type substrate, such as a silicon material doped with an n-type dopant (e.g., phosphorous or arsenic). In some embodiments, substrate 512 can include, germanium, diamond, a compound semiconductor, an alloy semiconductor, a silicon-on-insulator (SOI) structure, any other suitable material, or combinations thereof. Substrate 522 can be similar to substrate 512 and is not described here in detail for simplicity.

PG wire 514 can be a power supply line connected to a suitable voltage level, such as $V_{SS}$ (e.g., ground voltage reference) or $V_{DD}$ (e.g., power supply reference voltage) of integrated circuit power supply lines. PG wire 514 can be formed using any suitable conductive material, such as copper, cobalt, aluminum, tungsten, doped polysilicon, other suitable conductive material, and/or combinations thereof.

FIG. 5D illustrates chip 510 after forming via island 519 in substrate 512. In some embodiments, a dielectric layer is formed on PG wire 514, and via island 519 can be formed in the dielectric layer. Via island 519 can be formed by forming one or more openings in substrate 512 using a patterning process and depositing a conductive layer material in the openings. The patterning process can include forming a photoresist layer overlying substrate 512, exposing the photoresist layer to a pattern, performing post-exposure bake processes, and developing the photoresist layer to form a masking element including the resist. The masking element can protect regions of substrate 512, while etch processes are used to form an opening in substrate 512. The etching process can be a reactive ion etch (RIE) process and/or other suitable process. The etching process can continue until underlying PG wire 514 is exposed. After an opening is formed, conductive material can be deposited into the one or more openings using any suitable deposition method, such as chemical vapor deposition (CVD) plasma-enhanced CVD (PECVD), atomic layer deposition (ALD), physical vapor deposition (PVD), flowable CVD (FCVD), any other suitable process, or combinations thereof. A thickness $h_a$ of via island 519 can be between about 0.1 µm and about 1 µm. In some embodiments, the conductive layer material can be formed using any suitable conductive material, such as copper, cobalt, aluminum, tungsten, doped polysilicon, other suitable conductive material, and/or combinations thereof. A planarization process, such as chemical mechanical polishing process (CMP), can be used to planarize the top surfaces of substrate 512 and via island 519, according to some embodiments.

FIG. 5E illustrates chip 510 after forming vias 516 in via island 519. In some embodiments, vias 516 can be formed by forming openings in via island 519 and depositing a conductive layer material using any suitable deposition method, such as CVD, PECVD, ALD, PVD, FCVD, any other suitable process, or combinations thereof. In some embodiments, vias can be formed using any suitable conductive material, such as copper, cobalt, aluminum, tungsten, doped polysilicon, other suitable conductive material, and/or combinations thereof. In some embodiments, the resistivity of via islands and vias can be different. For example, vias can be formed with a conductive material that has an electrical resistivity lower than that of the conductive material that forms via islands. A planarization process, such as a CMP process, can be used to planarize the top surfaces of vias 516 and via island 519 such their top surfaces are substantially level (e.g., substantially coplanar), according to some embodiments. After vias and via islands are formed in chip 510, another chip or device can be aligned and hybrid-bonded to chip 510 to form 3D IC structures, such as the 3D IC structures illustrated in FIGS. 5A-5B.

Figure 6A:
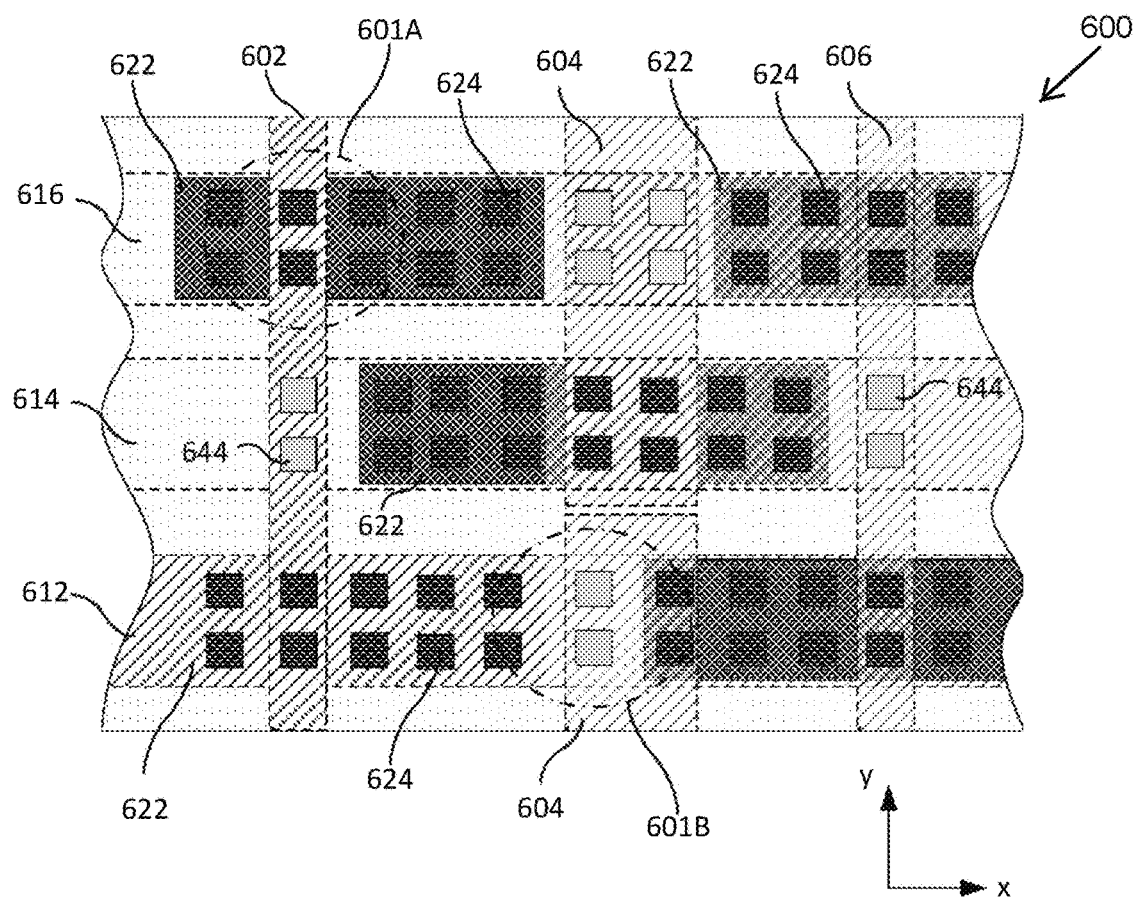
Figure 6B:
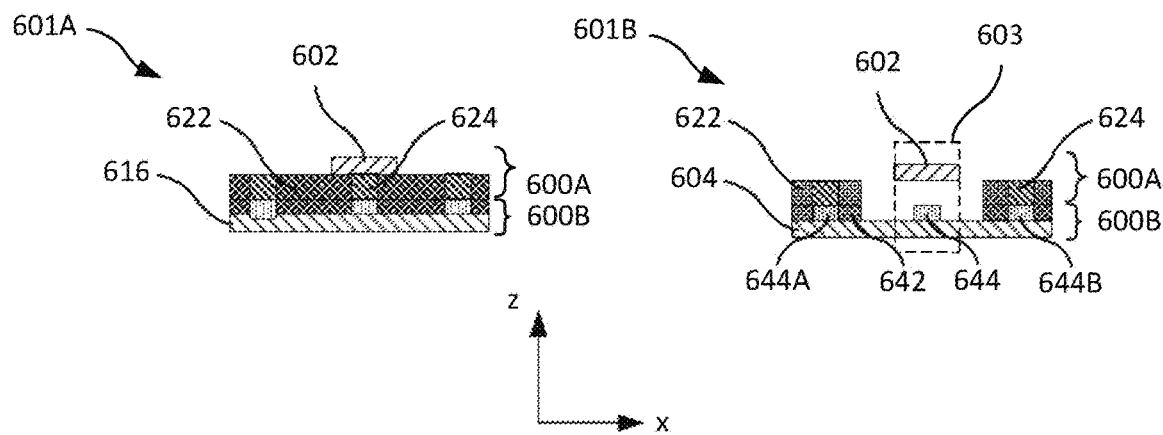

FIGS. 6A-6B illustrate an exemplary 3D IC structure incorporating via islands formed between PG wires of opposite directions, in accordance to some embodiments of the present disclosure. In some embodiments, the PG wires can be alternating $V_{DD}$ and $V_{SS}$ top metal wires in each of the dies. To achieve greater contact area, wires of a top metal layer can have orthogonal wire extensions to have more hybrid-bonded vias (HB-vias) for PG connection. In some embodiments, HB-vias connect to two metal top layers with the same net (e.g., $V_{DD}$ or $V_{SS}$ network) and form open HB-vias for top metal shapes belong to two different nets. The via islands can provide additional contact area between the PG wires that extend in different directions and allow additional vias to be formed. In some embodiments, via islands can extend along PG wires to maximize contact area and reduce electrical resistance. In some embodiments, PG wires overlap each other but are each connected to different voltages. In such configurations, one of the PG wires can include vias and a via island at the overlapping location and the other PG wires can have an open ended structure without the via or via island at the overlapping location. Such configuration provides the benefit of having uniform pattern density and increased capacitance between overlapping PG wires and improved dynamic IR analysis for high frequency operation. In addition, the increased conductive area between PG wires and additional vias can reduce electrical resistance and in turn reduce IR drop across chips. Exemplary portions of the 3D IC structure in FIGS. 6A-6B can further include other suitable structures and are not illustrated for simplicity. Components in portions of the 3D IC structure are for illustration purposes and are not drawn to scale.

FIG. 6A is a plan view of portions of 3D IC structure 600 incorporating via islands 622 formed between PG wires of hybrid-bonded chips. Although FIG. 6A is a plan view, it includes structures from various layers to illustrate the device and the structures' relevant positions. FIG. 6B illustrates selected portions 601A and 601B of FIG. 6A. A first chip 600A includes PG wires 602, 604, and 606 extending in a y-direction, and a second chip 600B includes PG wires 612, 614, and 616 extending in an x-direction. Via islands 622 are formed in first chip 600A and vias 624 are formed in via islands 622. First and second chips 600A and 600B are bonded together using any suitable bonding technique, such as hybrid bonding techniques. For example, corresponding via islands 622 and 642 and vias 624 and 644 are respectively aligned and bonded through a metal-metal bonding process. In some embodiments, PG wires 602-606 are substantially perpendicular to PG wires 612-616.

PG wires 602-606 and 612-616 can be connected to various voltages determined by device design and needs. For example, PG wires 602 and 606 of first chip 600A and PG wires 612 and 616 of second chip 600B can be connected to $V_{DD}$ (e.g., power supply reference voltage) of integrated circuit power supply lines. In some embodiments, PG wires 604 and 614 of first and second chips 600A and 6001, respectively, can be connected to $V_{SS}$ (e.g., ground voltage reference). Therefore, PG wire 602 from first chip 600A can be connected to PG wires 612 and 616 from second chip 600B because they share the same voltage. However, PG wire 602 should be electrically insulated from PG wire 614 since they are connected to different voltages. Other PG wires illustrated in FIG. 6A can be configured in a similar fashion. Via islands 622 can be configured to extend in a direction substantially parallel of the PG wire to occupy the device space between adjacent PG wires such that such device space is utilized to reduce electrical resistance between PG wires formed in adjacent layers. For example, PG wire 602 can be connected to PG wires 612 and 616, and via island 622 can extend along the direction of PG wires 612 and 616 (e.g., in the x-direction) such that device space between PG wires 602 and 604 can be fully utilized to reduce electrical resistance between first and second chips 600A and 600B.

PG wires that overlap each other can also be connected to different voltages. For example, PG wires 602 and 606 can be connected to a different voltage supply than that of the voltage supply provided to PG wire 614. In such configuration, PG wires 602 and 606 are electrically insulated from PG wire 614. In some embodiments, such electrical insulation can be achieved by omitting vias and via islands on one of the chips at the overlapping portions such that metal-metal bonding would not occur between the selected PG wires. For example, as shown in FIG. 6B, first chip 600A and 600B are hybrid-bonded; however, in region 603 where PG wire 604 and 612 overlap, no via island is formed. In addition, no via is formed in region 603 in first chip 600A such that when the hybrid bond is formed, no electrical connection exists between PG wires 602 and 612. However, the formation of via 644 in region 603 can provide the benefit of uniform pattern density for vias formed in second chip 600B, for example, vias 644, 644A, and 644B can form a uniform pattern density for vias which in turn provides the benefit of processing uniformity. In some embodiments, an open hybrid bond can be formed to avoid connectivity of two different signals between two different dies.

Figure 7A:
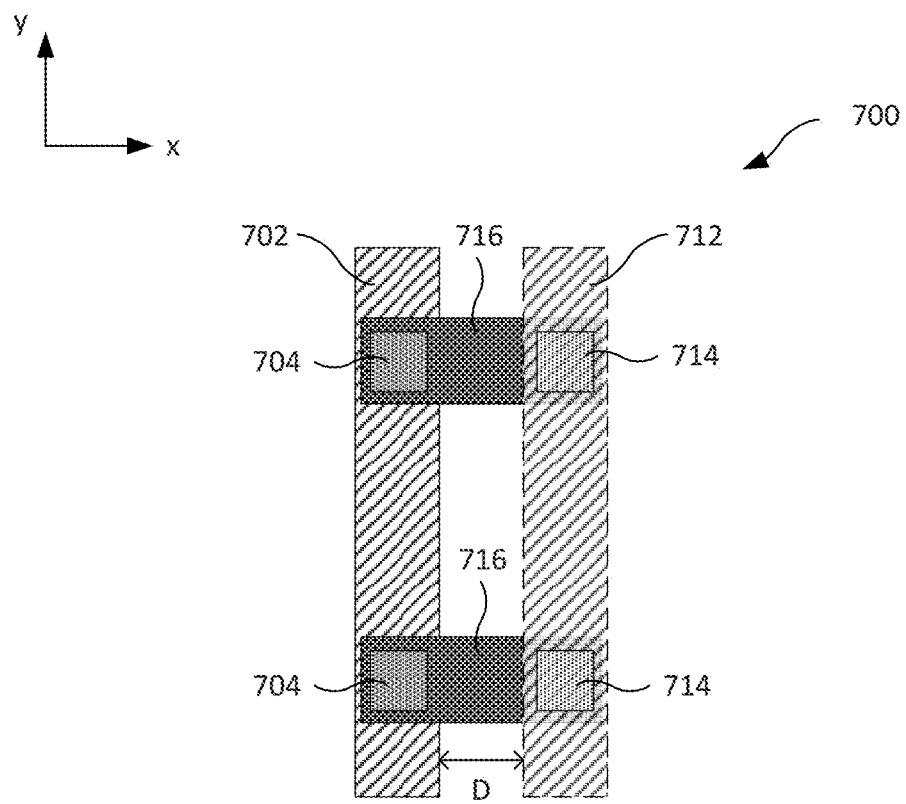
Figure 7B:
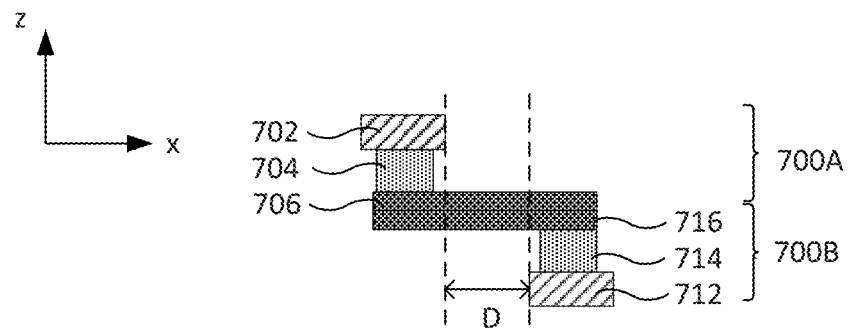

FIGS. 7A-7B are plan and cross-sectional views illustrating a 3D IC structure having conductive bonding pads that can provide additional contact area between substantially parallel PG wires, in accordance to some embodiments of the present disclosure. In some embodiments, PG wires are substantially in parallel and conductive bonding pads can provide the benefit of (i) additional cross-sectional area that in turn reduces electrical resistance; and (ii) greater tolerance for PG wire alignment. The conductive bonding pads can also provide additional device area to incorporate vias for further reducing electrical resistances. Exemplary portions of the 3D IC structure in FIGS. 7A-7B can further include other suitable structures and are not illustrated for simplicity. Components in portions of the 3D IC structure are for illustration purposes and are not drawn to scale.

FIGS. 7A-7B illustrate an exemplary 3D IC structure 700 that includes PG wires 702 and 712 formed respectively on two chips 700A and 700B hybrid bonded together. First chip 700A further includes via 704 and conductive pad 706. Similarly, second chip 700B further includes via 714 and conductive pad 716. Conductive pads 706 and 716 from first and second chips 700A and 700B, respectively, can be bonded together during the hybrid bonding process. As shown in FIGS. 7A-7B, an offset D between PG wires 702 and 712 would cause an electrical disconnection between vias 704 and 714; however, conductive pads 706 and 716 can be formed on first and second chips 700A and 700B, respectively, and configured to electrically connect the offset vias. Therefore, compared to vias aligned to one another (e.g., with a substantial amount of overlap) the configuration illustrated in FIGS. 7A-7B can provide increased cross-sectional area for reducing electrical resistance. Further, offset D can provide a greater alignment tolerance for aligning PG wires 702 and 712 since conductive pads 706 and 716 can provide electrical connection between PG wires 702 and 712. In some embodiments, offset D can be in a range between 0.1 μm and 1.35 μm, however can be adjusted based on the technology nodes. In some embodiments, a greater offset D can provide greater contact area between conductive pads 706 and 716, which in turn further reduces electrical resistance but would require greater device area for implementation.

Figure 8:
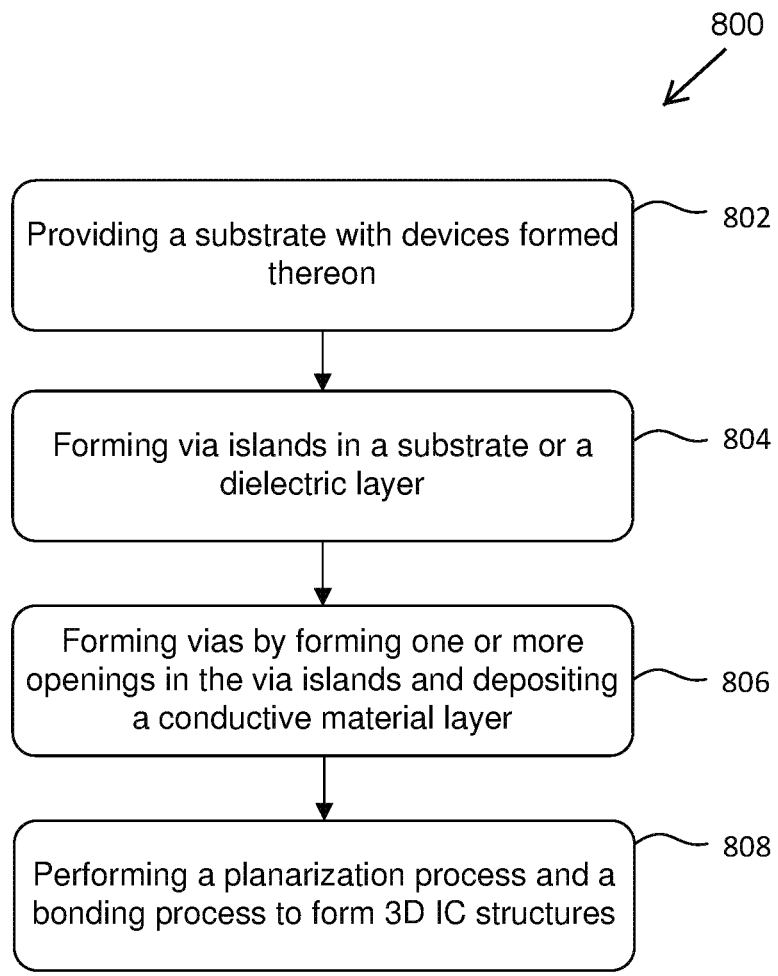
FIG. 8 is a flow diagram of an exemplary method of forming three-dimensional system on integrated chip structures with via islands, according to some embodiments.

FIG. 8 is a flow diagram of an exemplary method 800 of forming a 3D IC structure with via islands, in accordance with some embodiments of the present disclosure. Based on the disclosure herein, operations in method 800 can be performed in a different order and/or vary.

At operation 802, a semiconductor substrate with devices formed thereon is provided, in accordance with some embodiments. Semiconductor devices are formed on and/or within a semiconductor structure. The substrate can be a silicon substrate, according to some embodiments. In some embodiments, the substrate can be (i) another semiconductor, such as germanium; (ii) a compound semiconductor including silicon carbide, gallium arsenide, gallium phosphide, indium phosphide, indium arsenide, GaAsP, AlInAs, AlGaAs, GaInAs, GaInP, GaInAsP, indium antimonide, any other suitable material, or any combination thereof; (iii) an alloy semiconductor including SiGe; or (iv) combinations thereof. In some embodiments, the substrate can be an SOI. In some embodiments, the substrate can be an epitaxial material. In some embodiments, the substrate can also include a processed integrated circuit wafer that includes, for example, transistors arranged to be CMOS circuits, RF circuitry, and the like. In some embodiments, active and passive devices—such as transistors, diodes, capacitors, resistors, inductors, and the like—can be formed on and/or within the semiconductor substrate. An example of the substrate can be substrate 512 as described with respect to FIG. 5C.

At operation 804, via islands are deposited in a substrate or a dielectric layer, in accordance with some embodiments. Via islands can be disposed in a substrate or a dielectric layer to provide increased conductive area in addition to vias. Openings can be formed in the substrate and/or dielectric layers by performing a patterning process and depositing a conductive layer material using any suitable deposition method, such as a PVD process or a CVD process. A thickness $h_a$ of via island 519 can be between about 0.1 μm and about 1.5 μm. The thickness $h_a$ can be adjusted based on different technology nodes. In some embodiments, the conductive layer material can be formed using any suitable conductive material, such as copper, cobalt, aluminum, tungsten, doped polysilicon, other suitable conductive material, and/or combinations thereof. Examples of via islands can be via islands 519 described above in FIGS. 5D-5E.

At operation 806, vias can be formed by forming openings in the via islands and depositing a conductive layer material in the openings using any suitable deposition method. In some embodiments, vias can be formed using any suitable conductive material, such as copper, cobalt, aluminum, tungsten, doped polysilicon, other suitable conductive material, and/or combinations thereof. In some embodiments, the resistivity of via islands and vias can be different. For example, vias can be formed with a conductive material that has an electrical resistivity lower than the conductive material that forms via islands. Examples of vias can be vias 516 and 526 described in FIGS. 5A-5B.

At operation 808, a planarization process can be performed and chips can be bonded to form 3D IC structures. A planarization process, such as a CMP process, can be used to planarize the top surfaces of vias, via islands, and the substrate or dielectric layer, according to some embodiments. After the top surfaces are planarized to a nominal uniformity, another chip or device can be aligned and bonded to form 3D IC structures, such as the 3D IC structure illustrated in 5A-5B.

Various embodiments described herein are directed to reducing IR drop in 3D IC structures. For example, exemplary embodiments at least include (i) power grid (PG) via arrays including TSVs that reduce PG electrical resistance; (ii) a grid wall including vias can be formed along a perimeter of the chip and surrounding the active devices; (iii) via islands formed between PG wires of adjacent metal layers or chips; and (iv) conductive bonding pads providing additional contact area between PG wires if the PG wires are not aligned (e.g., not directly above one another with an horizontal offset). It should be noted that the structures and methods described in the present application can also be applied to other conductive structures, such as signal carrying wires, ground wires, and any other suitable conductive structures.

In some embodiments, a semiconductor structure includes a first chip including a first conductive line and a first conductive island formed on the first conductive line. The first chip also includes a first plurality of vias formed in the first conductive island and electrically coupled to the first conductive line. The semiconductor structure further includes a second chip bonded to the first chip, where the second chip includes a second conductive line and a second conductive island formed on the second conductive line. The second chip also includes a second plurality of vias formed in the second conductive island and electrically coupled to the second conductive line.

In some embodiments, a semiconductor structure includes a first chip including a first substrate and a first power grid (PG) line formed in the first substrate. The first chip also includes a first conductive island formed in the first substrate and on the first PG line and a first plurality of vias formed in the first conductive island and electrically coupled to the first PG line. The semiconductor structure also includes a second chip bonded to the first chip. The second chip includes a second substrate and a second PG line formed in the second substrate. The second chip further includes a second conductive island formed in the second substrate and on the second PG line. The second chip further includes a second plurality of vias formed in the second conductive island and electrically coupled to the second PG line. The first and second chips are bonded at top surfaces of the first and second conductive islands and at top surfaces of the first and second plurality of vias, respectively.

In some embodiments, a method for forming a semiconductor structure includes providing a first substrate in a first chip and depositing a first conductive line in the first substrate. The method also includes depositing a first conductive island in the first substrate and on the first conductive line. The method further includes depositing a first plurality of vias in the first conductive island and on the first conductive line. The method also includes planarizing top surfaces of the first conductive island and the first plurality of vias and bonding a second chip to the first chip.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor structure, comprising:
   providing a first substrate in a first chip;
   depositing a first conductive line in the first substrate;
   depositing a first conductive island in the first substrate and on a top surface of the first conductive line;
   depositing a first plurality of vias in the first conductive island and on the top surface of the first conductive line;
   planarizing top surfaces of the first conductive island and the first plurality of vias;
   forming a second conductive line in a second chip and in contact with a second conductive island;
   bonding the second chip to the first chip, comprising bonding the second conductive island of the second chip to the first conductive island of the first chip; and
   electrically coupling the first and second conductive lines through the first and second conductive islands.

2. The method of claim 1, wherein bonding the second chip to the first chip comprises bonding a second plurality of vias of the second chip to the first plurality of vias of the first chip.

3. The method of claim 1, wherein depositing the first conductive island comprises depositing copper, cobalt, aluminum, tungsten, or doped polysilicon.

4. The method of claim 1, wherein bonding the second chip to the first chip comprises hybrid bonding the second chip to the first chip.

5. The method of claim 1, wherein bottom surfaces of the first plurality of vias are in contact with the top surface of the first conductive line.

6. A method, comprising:
   forming a first chip, comprising:
      depositing a first conductive line;
      forming a first conductive island on the first conductive line;

forming a first plurality of vias in the first conductive island; and electrically coupling the first plurality of vias to the first conductive line;

forming a second chip, comprising:

depositing a second conductive line;

forming a second conductive island on the second conductive line;

forming a second plurality of vias in the second conductive island; and electrically coupling the second plurality of vias to the second conductive line;

bonding the first chip to the second chip; and electrically coupling the first and second conductive lines through the first and second conductive islands.

7. The method of claim 6, wherein bonding the first to the second chip comprises:

bonding top surfaces of the first and second conductive islands; and bonding top surfaces of the first and second pluralities of vias.

8. The method of claim 6, wherein forming the first plurality of vias comprises:

forming a plurality of openings in the first conductive island; and depositing a conductive material in the plurality of openings.

9. The method of claim 6, further comprising electrically coupling the first and second conductive lines to power grid lines.

10. The method of claim 6, wherein:

forming the first conductive island comprises depositing a first conductive material; and forming the first plurality of vias comprises depositing a second conductive material different from the first conductive material.

11. The method of claim 10, wherein the first conductive material comprises a first resistivity and the second conductive material comprises a second resistivity greater than the first resistivity.

12. The method of claim 6, wherein depositing the second conductive material comprises depositing copper, cobalt, aluminum, tungsten, or doped polysilicon.

13. A method, comprising:

forming a first chip, comprising:

forming a first power grid (PG) line in a first substrate;

forming a first conductive island in the first substrate and on a top surface of the first PG line;

etching the first conductive island to form a first plurality of openings, wherein the first plurality of openings expose portions of the top surface of the first PG line; and depositing a first conductive material in the first plurality of openings and on the exposed portions of the top surface of the first PG line to form a first plurality of vias, wherein the first plurality of vias is electrically coupled to the first PG line;

forming a second chip, comprising:

forming a second PG line in a second substrate;

forming a second conductive island in the second substrate and on the second PG line;

etching the second conductive island to form a second plurality of openings; and depositing a second conductive material in the second plurality of openings to form a second plurality of vias, wherein the second plurality of vias is electrically coupled to the second PG line; and bonding the first and second chips at top surfaces of the first and second conductive islands and at top surfaces of the first and second pluralities of vias, respectively.

14. The method of claim 13, wherein the first and second pluralities of openings expose portions of the first and second PG lines, respectively.

15. The method of claim 13, wherein an electrical resistivity of the first conductive material is lower than an electrical resistivity of the first conductive island.

16. The method of claim 13, further comprising:

performing a first planarization process such that the top surfaces of the first conductive island and the first plurality of vias are substantially level; and performing a second planarization process such that the top surfaces of the second conductive island and the second plurality of vias are substantially level.

17. The method of claim 13, wherein bottom surfaces of the first plurality of vias are in contact with the top surface of the first PG line.

18. The method of claim 13, further comprising electrically coupling the first and second PG lines through the first and second conductive islands.

* * * * *